US010559597B1

(12) United States Patent
Li et al.

(10) Patent No.: US 10,559,597 B1
(45) Date of Patent: Feb. 11, 2020

(54) DISPLAY PANEL AND DISPLAY DEVICE

(71) Applicant: WUHAN TIANMA MICRO-ELECTRONICS CO., LTD., Wuhan (CN)

(72) Inventors: Bo Li, Wuhan (CN); Tianqing Hu, Shanghai (CN); Zhaokeng Cao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/232,341

(22) Filed: Dec. 26, 2018

(30) Foreign Application Priority Data

Sep. 30, 2018 (CN) .......................... 2018 1 1157291

(51) Int. Cl.
*G09G 3/22* (2006.01)
*H01L 27/12* (2006.01)

(52) U.S. Cl.
CPC ........... *H01L 27/1218* (2013.01); *G09G 3/22* (2013.01); *H01L 27/124* (2013.01); *H01L 27/1255* (2013.01); *G09G 2310/0267* (2013.01); *G09G 2310/0286* (2013.01)

(58) Field of Classification Search
CPC ............... H01L 27/1218; H01L 27/124; H01L 27/1255; G09G 3/22; G09G 2310/0267; G09G 2310/0286
See application file for complete search history.

(56) References Cited

U.S. PATENT DOCUMENTS

| 9,007,541 | B2* | 4/2015 | Chen ..................... G02F 1/1362 349/38 |
| 9,099,357 | B2* | 8/2015 | Ono ...................... H01L 27/124 |
| 9,099,404 | B2* | 8/2015 | Niu ..................... H01L 27/3276 |
| 2013/0105803 | A1* | 5/2013 | Song .................... H01L 27/124 257/59 |

FOREIGN PATENT DOCUMENTS

CN            104332484 A        2/2015

* cited by examiner

*Primary Examiner* — Sejoon Ahn
(74) *Attorney, Agent, or Firm* — Anova Law Group PLLC

(57) ABSTRACT

A display panel includes a display area which has a notch and a non-display area surrounding the display area. The non-display area includes a notched non-display area that surrounds the notch by substantially in half. The display panel also includes an encapsulation cover located at a side of the display layer away from the array layer, and an encapsulant disposed between the array layer and the encapsulation cover. The encapsulant is located in the non-display area and surrounds the display layer. Moreover, the display panel includes an encapsulated metal located in the non-display area. The encapsulated metal is disposed in an array layer. In a laser-sintering process of the encapsulant, the encapsulated metal is used for reflecting laser light. An orthographic projection of the encapsulated metal in the substrate layer has a non-closed pattern, and the encapsulated metal is undisposed in at least a portion of the notched non-display area.

20 Claims, 15 Drawing Sheets

DISPLAY PANEL AND DISPLAY DEVICE

CROSS-REFERENCES TO RELATED APPLICATIONS

This application claims priority of Chinese Patent Application No. 201811157291.X, filed on Sep. 30, 2018, the entire contents of which are hereby incorporated by reference.

FIELD OF THE INVENTION

The present disclosure generally relates to the field of display technologies and, more particularly, relates to a display panel and a display device.

BACKGROUND

In current display device technologies, display panels mainly include two major types: a liquid crystal display panel and an organic self-luminous display panel. In a liquid crystal display panel, an electric field capable of controlling deflection of liquid crystal molecules is formed by applying an electric voltage between a pixel electrode and a common electrode. The electric field controls light transmission to realize a display function of the display panel. An organic self-luminous display panel uses an organic electroluminescent material. When an electric current passes through the organic electroluminescent material, the electroluminescent material emits light, realizing a display function of the display panel.

With the application of display technologies in smart wearables and other portable electronic devices, design of electronic products has been pursuing user-friendly experiences. Further, sensory experiences of users are becoming significant in the design of electronic products. For example, performances such as wide viewing angle, high resolution, narrow border, and high screen-to-body ratio, have become selling points of various types of electronic products. Accordingly, it is urgent to provide a display panel and a display device with a narrow border and a high screen-to-body ratio.

The disclosed methods and structures are directed to solve one or more problems set forth above and other problems in the art.

BRIEF SUMMARY OF THE DISCLOSURE

One aspect of the present disclosure includes a display panel. The display panel includes a display area and a non-display area surrounding the display area. The display area is disposed with a plurality of data lines extending along a first direction. The display area has a notch, and a boundary of the display area is recessed into the display area in a second direction to form the notch. The second direction intersects with the first direction. The non-display area includes a notched non-display area that surrounds the notch by substantially in half. The display panel includes a substrate layer and an array layer located over the substrate layer. The data lines are located at the array layer. The display panel also includes a display layer located at a side of the array layer away from the substrate layer. The display layer includes a plurality of light emitting components. The display panel also includes an encapsulation cover located at a side of the display layer away from the array layer, and an encapsulant disposed between the array layer and the encapsulation cover. The encapsulant is located in the non-display area and surrounds the display layer. Moreover, the display panel includes an encapsulated metal located in the non-display area. The encapsulated metal is disposed in the array layer. In a laser-sintering process of the encapsulant, the encapsulated metal is used for reflecting laser light. An orthographic projection of the encapsulated metal in the substrate layer has a non-closed pattern, and the encapsulated metal is undisposed in at least a portion of the notched non-display area.

Another aspect of the present disclosure includes a display device. The display device includes a display panel comprising a display area and a non-display area surrounding the display area. The display area is disposed with a plurality of data lines extending along a first direction. The display area has a notch, and a boundary of the display area is recessed into the display area in a second direction to form the notch. The second direction intersects with the first direction. The non-display area includes a notched non-display area that surrounds the notch by substantially in half. The display panel includes a substrate layer and an array layer located over the substrate layer. The data lines are located at the array layer. The display panel also includes a display layer located at a side of the array layer away from the substrate layer. The display layer includes a plurality of light emitting components. The display panel also includes an encapsulation cover located at a side of the display layer away from the array layer, and an encapsulant disposed between the array layer and the encapsulation cover. The encapsulant is located in the non-display area and surrounds the display layer. Moreover, the display panel includes an encapsulated metal located in the non-display area. The encapsulated metal is disposed in the array layer. In a laser-sintering process of the encapsulant, the encapsulated metal is used for reflecting laser light. An orthographic projection of the encapsulated metal in the substrate layer has a non-closed pattern, and the encapsulated metal is undisposed in at least a portion of the notched non-display area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

It should be noted that arrangements of components and steps, numerical expressions and numerical values set forth in exemplary embodiments are not intended to limit the scope of the present disclosure.

Techniques, methods and apparatus known to those skilled in the relevant art may not be discussed in detail, but where appropriate, these techniques, methods and apparatus should be considered as a part of the disclosed embodiments.

Figure 1:
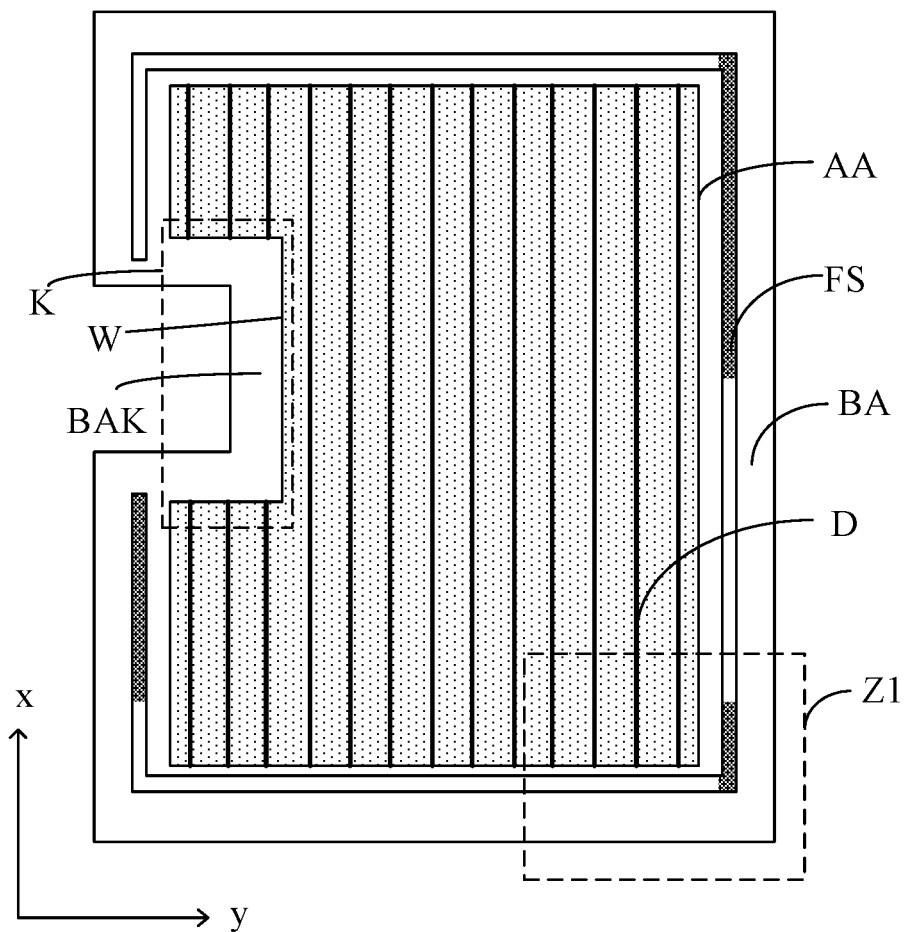
FIG. 1 illustrates a top view of an exemplary display panel consistent with the disclosed embodiments.

The present disclosure provides a display panel. FIG. 1 illustrates a top view of an exemplary display panel, and FIG. 2 illustrates a schematic view of a layered structure of an exemplary display panel.

As shown in FIG. 1, a display panel includes a display area AA and a non-display area BA surrounding the display area AA. The display area AA is disposed with a plurality of data lines D extending along a first direction x. The display area AA has a notch K, and a boundary W of the display area AA is recessed into the display area AA in a second direction y to form the notch K. The second direction y intersects with the first direction x. The non-display area BA includes a notched non-display area BAK that surrounds the notch K by substantially in half. No pixels are disposed in the notch K, and thus the notch K does not have a display function.

Figure 2:
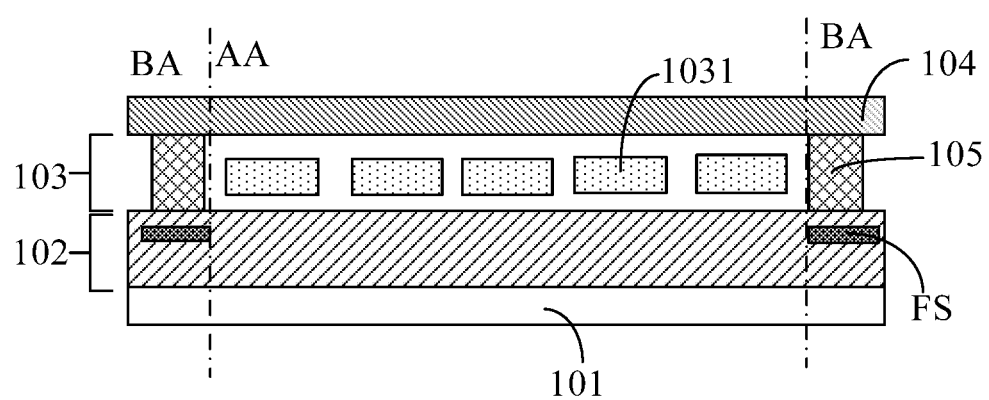
FIG. 2 illustrates a schematic view of a layered structure of an exemplary display panel consistent with the disclosed embodiments.

Referring to FIG. 2, an exemplary display panel includes a substrate layer 101, an array layer 102 located over the substrate layer 101, data lines D (not shown) located at the array layer 102, a display layer 103 located at a side of the array layer 102 away from the substrate layer 101, and an encapsulation cover 104 located at the side of the display layer 103 away from the array layer 102. The display layer 103 includes a plurality of light emitting components 1031. An encapsulant 105 is disposed between the array layer 102 and the encapsulation cover 104, and the encapsulant 105 is located in the non-display area BA and surrounds the display layer AA. The display panel further includes an encapsulated metal FS located in the non-display area BA, and the encapsulated metal FS is disposed in the array layer 102. In a laser-sintering process of the encapsulant 105, the encapsulated metal FS is used for reflecting laser light. As shown in FIG. 1, an orthographic projection of the encapsulated metal FS in the substrate layer 101 has a non-closed pattern, and the encapsulated metal FS is undisposed in at least a portion of the notched non-display area BAK.

In a laser-sintering process of the encapsulant, the encapsulated metal reflects laser light to make the encapsulant melted, and then the encapsulant is bonded to the array layer 103 and the encapsulation cover 104 to realize the encapsulation of the display layer and block the damage of water and oxygen to the light emitting device. In a conventional display panel, the encapsulated metal encloses the display area, forming a closed pattern. The encapsulated metal may be disposed at the periphery of a display panel, and occupies certain space in the non-display area. In a display panel of the present disclosure, no package metal is disposed in at least a part of a notched non-display area. This configuration may save space in the notched non-display area, and thereby increase the screen ratio of the display panel.

Figure 3:
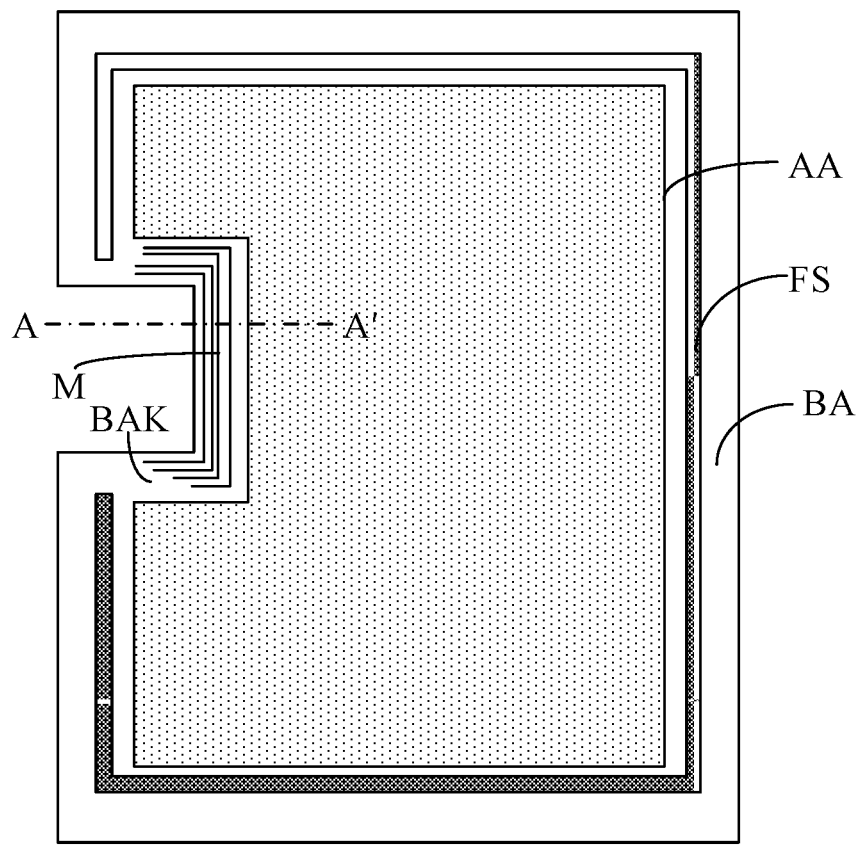
FIG. 3 illustrates a schematic view of an exemplary implementation approach of a display panel consistent with the disclosed embodiments.

Exemplary implementation approaches are provided in the present disclosure. FIG. 3 illustrates a schematic view of an exemplary implementation approach of a display panel, and FIG. 4 illustrates a schematic cross-sectional view at cross section A-A' in FIG. 3.

Figure 4:
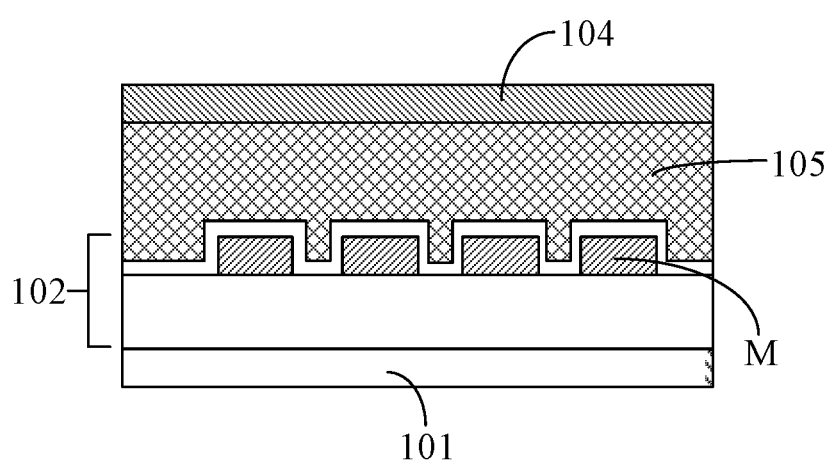
FIG. 4 illustrates a schematic cross-sectional view at cross section A-A' in FIG. 3, consistent with the disclosed embodiments.

Referring to FIG. 3 and FIG. 4, a plurality of metal lines M are disposed in the notched non-display area BAK, and at least a part of the metal lines M overlap with the encapsulant 105 in a direction perpendicular to the display panel. In a laser-sintering process of the encapsulant 105, the metal lines M reflect laser light. The metal lines M may be signal lines in the display panel. That is, the metal lines M may be used for transmitting signals when the display panel is in normal use. In the fabrication process of a display panel, the metal lines may be used to reflect laser light in a packaging process. That is, the metal lines may be reused as an encapsulated metal. In the case when encapsulated metal is undisposed in the notched non-display area, the encapsulant may still be melted and adhered to the array layer by laser light reflected by the metal lines.

In addition, in the display panel as shown in FIG. 4, the two adjacent metal lines M are separated in a certain distance to ensure mutual insulation, so the place where the metal lines M are located is an uneven surface. As long as the layer produced over the metal lines M is not a planarization layer, its surface may still be uneven. In a packaging process, the encapsulant is in contact with the uneven surface. After the encapsulant is melted by laser, it flows into a groove of the uneven surface, increasing the contact area between the encapsulant and the array layer. Accordingly, when the metal lines are reused as a encapsulated metal, the contact area between the encapsulant and the array layer may be increased, the bonding performance may be improved, and thus the packaging reliability may be ensured. This configuration may save the space of the notched gap non-display area while ensuring the packaging reliability of the notched non-display area.

Figure 5:
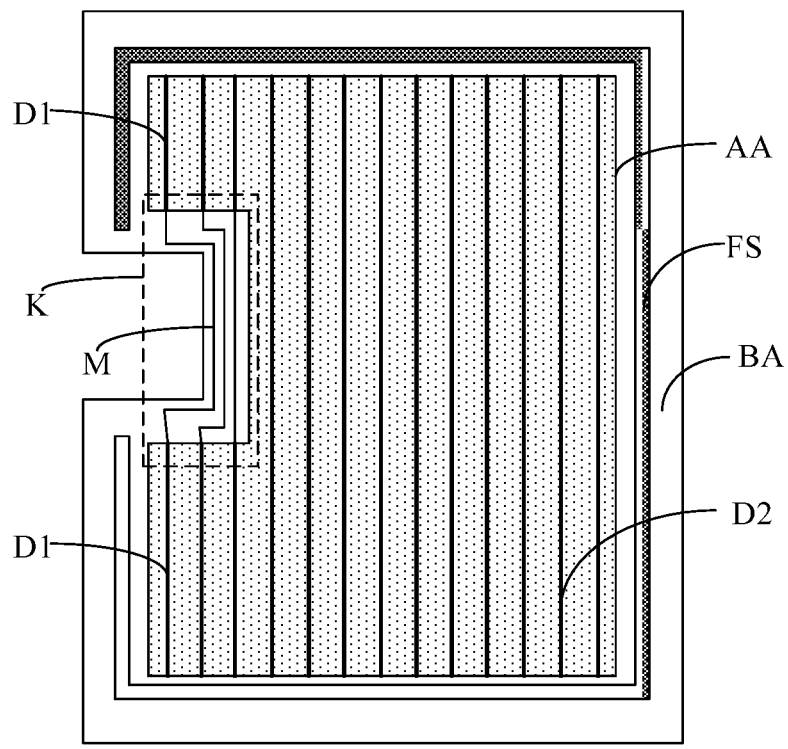
FIG. 5 illustrates a schematic view of another exemplary implementation approach of a display panel consistent with the disclosed embodiments.

FIG. 5 illustrates a schematic view of another exemplary implementation approach of a display panel. As shown in FIG. 5, two data lines D1 located at two sides of the notch K and in a same column are electrically connected through a metal line M. The two data lines D1 located at two sides of the notch K may be used to transmit signals through the metal line M. Meanwhile, since the area where the notch K is located is undisposed with pixels, the number of sub-pixels electrically connected to the data lines D1 located at two sides of the notch K is reduced, and so the load on the data lines D1 is reduced. Accordingly, in the display panel, there are data lines with different loads. As shown in FIG. 5, the load generated by electrical connection to sub-pixels on the data line D2 is larger than the load generated by electrical connection to sub-pixels on the data line D1, accordingly, the brightness levels of the sub-pixels electrically connected to data lines D2 and data lines D1, respectively, are different. After two data lines D1 located at two sides of the notch K are electrically connected through a metal line M, the electrical resistance of the metal line M may increase the load on the data lines D1 to a certain extent. Accordingly, the metal line M may balance the load difference between the data lines D1 and the data lines D2, and may thus improve the display unevenness of the display panel.

In addition, in a laser-sintering process of encapsulant, the metal lines electrically connected to data lines may be reused as an encapsulated metal. In this process, the laser has no adverse effect on characteristics of the metal lines, such as electrical resistance, and does not affect the performance of the metal lines in subsequent signal transmission. In the notched non-display area, when the metal lines are reused as an encapsulated metal, no additional encapsulated metal is needed. This configuration may save the space of the notched non-displayed area, and narrow the notched non-display area.

Figure 6:
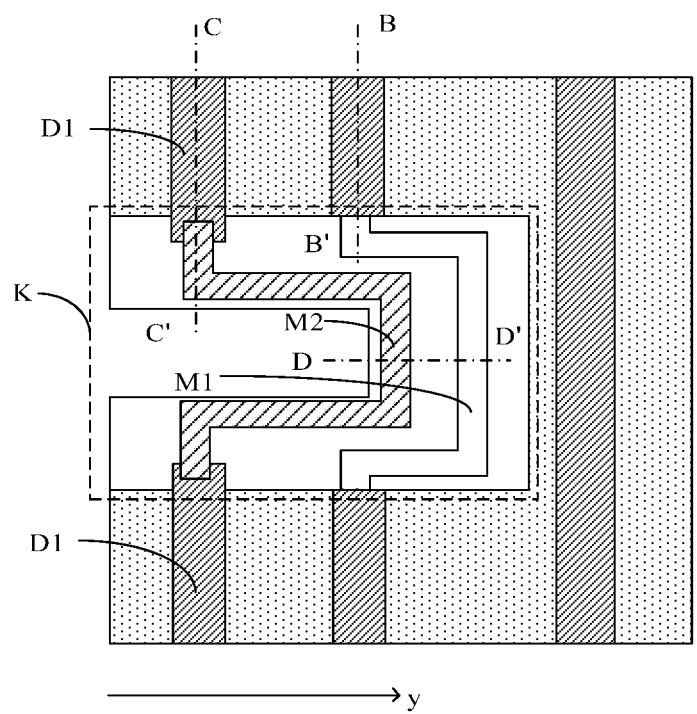
FIG. 6 illustrates a partial schematic view of another exemplary implementation approach of a display panel consistent with the disclosed embodiments.
Figure 7:
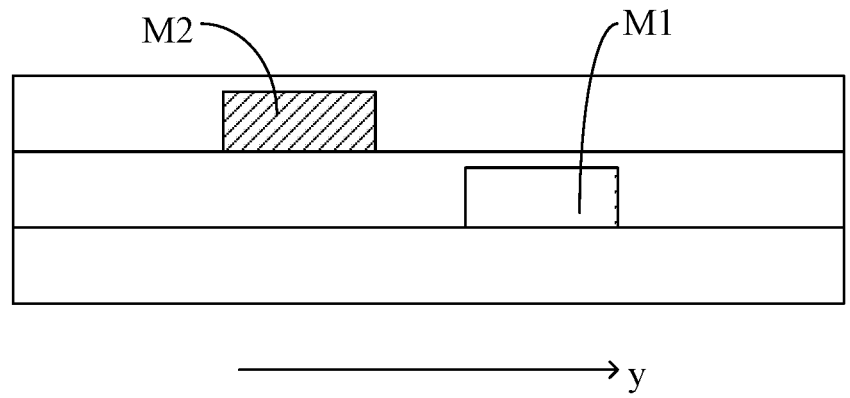
FIG. 7 illustrates a schematic cross-sectional view at cross section D-D' in FIG. 6, consistent with the disclosed embodiments.
Figure 8:
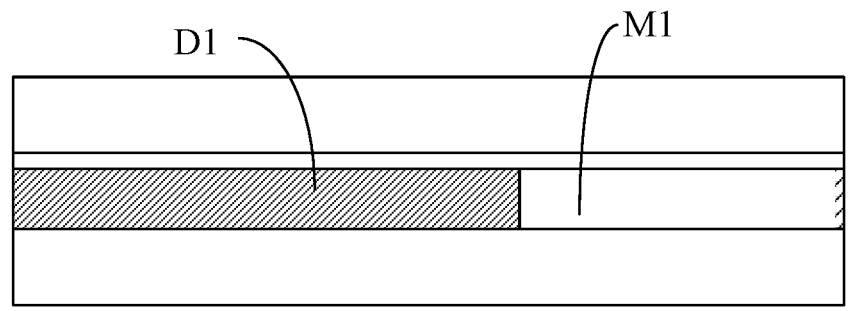
FIG. 8 illustrates a schematic cross-sectional view at cross section B-B' in FIG. 6, consistent with the disclosed embodiments.
Figure 9:
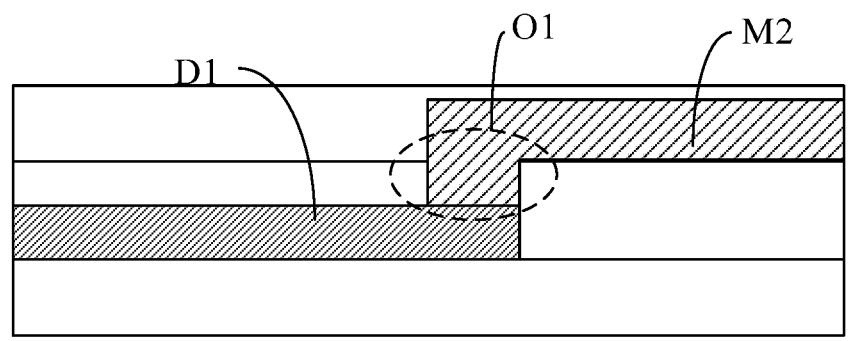
FIG. 9 illustrates a schematic cross-sectional view at cross section C-C' in FIG. 6, consistent with the disclosed embodiments.

In one embodiment, metal lines include first metal lines and second metal lines that are located at different layers. FIG. 6 illustrates a partial schematic view of another exemplary implementation approach of a display panel. FIG. 7 illustrates a schematic cross-sectional view at cross section D-D' in FIG. 6. FIG. 8 illustrates a schematic cross-sectional view at cross section B-B' in FIG. 6. FIG. 9 illustrates a schematic cross-sectional view at cross section C-C' in FIG. 6.

As shown in FIGS. 6 and 7, two data lines D1 located at two sides of the notch K and in a same column are electrically connected by a metal line M. The metal lines include a first metal line M1 and a second metal line M2. The first metal line M1 and the second metal line M2 are respectively located in different layers, and the first metal line M1 and the second metal line M22 are fabricated in different fabrication processes. In this way, the spacing in the second direction y between the first metal line M1 and the second metal line M2 may be reduced, and the space in the notched non-display area BAK occupied by a plurality of metal lines may be reduced. This configuration may narrow the notched non-display area BAK.

As shown in FIG. 8, a first metal line M1 and a data line D1 are located in a same layer, and the first metal line M1 is directly connected to the data line D1. In the fabrication procedure of a display panel, a first metal line and a data line may be fabricated in a same process.

As shown in FIG. 9, a second metal line M2 and a data line D1 are connected through a first via hole O1. The second metal line may be fabricated by reusing an original process in the production of the display panel, or a new fabrication process may be added to the display panel to fabricate the second metal lines. In the present disclosure, since the second metal lines and the first metal lines are formed in different fabrication processes, the second metal lines and the first metal lines may partially overlap in a direction perpendicular to the display panel. Accordingly, the space occupied by the metal lines in the notched non-display area may be further reduced.

In the present disclosure, since the first metal lines and the second metal lines are fabricated in different fabrication processes, and the materials of the first metal lines and the second metal lines may be same or different. Preferably, the first metal lines and the second metal lines are made of a same material. In this way, the impedances of the first metal lines and the second metal lines may be substantially same, thereby the impedance difference of the data lines connected respectively to the first metal lines and the second metal lines in the display panel may be reduced.

Figure 10:
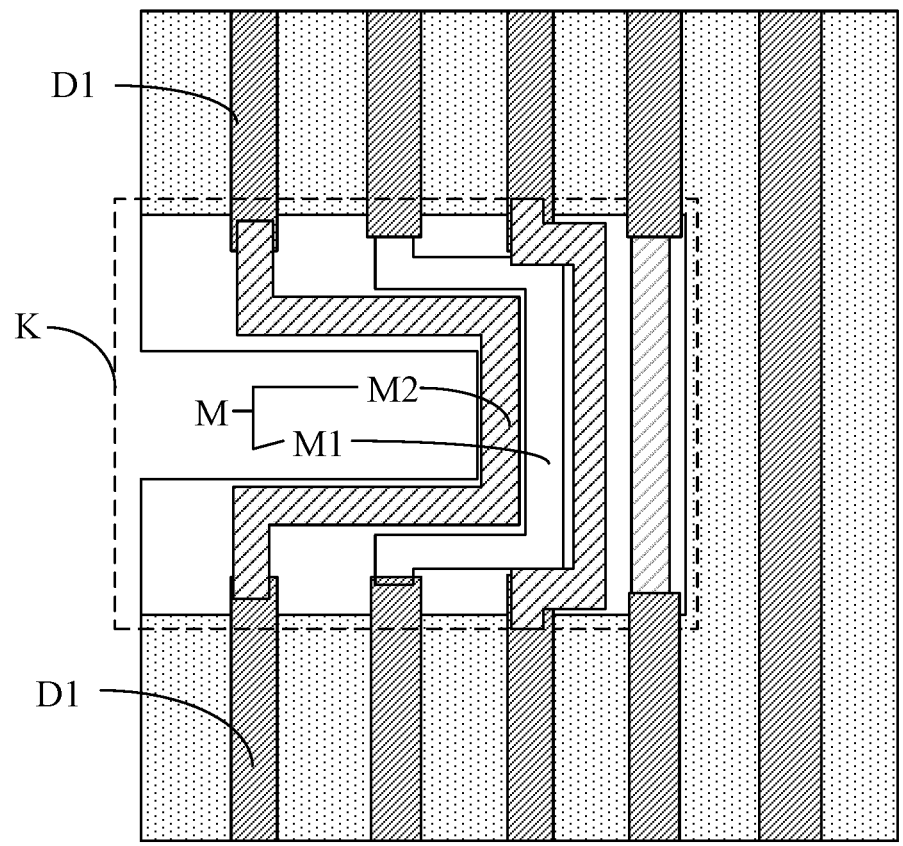
FIG. 10 illustrates a partial schematic view of another exemplary implementation approach of a display panel consistent with the disclosed embodiments.

FIG. 10 illustrates a partial schematic view of another exemplary implementation approach of a display panel. As shown in FIG. 10, two data lines D1 located at two sides of the notch K and in a same column are electrically connected through a metal line M. The metal lines M include a first metal line M1 and a second metal line M2 located at different layers. In a direction in which the metal lines M are arranged, the first metal lines M1 and the second metal lines M2 are alternately disposed. In one embodiment, after the two data lines on two sides of the notch are electrically connected by a metal line, the electrical resistance of the metal line may increase the load on the data lines to a certain extent, and improve the uneven display of the display panel. Meanwhile, the metal lines includes a first metal line and a second metal line located in different layers, and this configuration may reduce the space occupied by the plurality of metal lines in the notched non-display area, and may thus narrow the notched non-display area.

In addition, in a direction in which the metal lines are arranged, the first metal lines and the second metal lines are alternately disposed, and the data lines electrically connected to the first metal lines and the data lines electrically connected to the second metal lines are alternately disposed in the display panel. When the first metal lines and the second metal lines are made of different materials, the influence of the resistance difference between the first metal lines and the second metal lines on loads of the data lines may be weakened, and the uniformity of the display panel may be improved.

Figure 11:
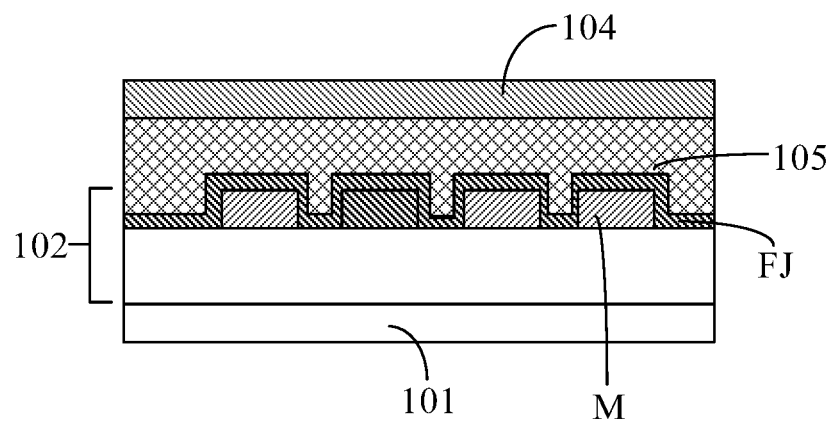
FIG. 11 illustrates a schematic cross-sectional view of another exemplary implementation approach at cross section A-A' in FIG. 3, consistent with the disclosed embodiments.

In one embodiment, a display panel further includes a packaging insulation layer. The packaging insulation layer is disposed between the encapsulated metal layer and the encapsulant. FIG. 11 illustrates a schematic cross-sectional view of another exemplary implementation approach at cross section A-A' in FIG. 3. As shown in FIG. 11, in the notched non-display area, a packaging insulation layer FJ is located between the metal lines M and the encapsulant 105. The material of the encapsulant usually comprises a silicon-based material, and its adhesion to metal materials is weak. In one embodiment, a packaging insulation layer is disposed on the metal lines. The packaging insulation layer may protect the metal lines, and may also improve the bonding performance of the encapsulant and the array layer, ensuring the reliability of the packaging performance.

Material of the packaging insulation layer may include silicon oxide or silicon nitride. When silicon oxide or silicon nitride, used as an inorganic material, is in contact with a packaging adhesive made of a silicon-based material, it has good bonding properties and high bonding strength, and may thus ensure reliability of packaging performance.

Figure 12:
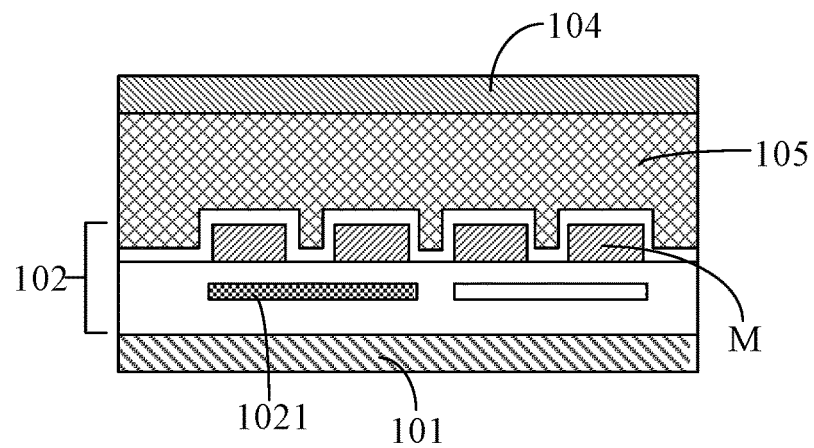
FIG. 12 illustrates a schematic cross-sectional view of another exemplary implementation approach at cross section A-A' in FIG. 3, consistent with the disclosed embodiments.

FIG. 12 illustrates a schematic cross-sectional view of another exemplary implementation approach at cross section A-A' in FIG. 3. As shown in FIG. 12, the notched non-display area is further provided with a capacitance compensation portion 1021, and the capacitance compensation portion 1021 is insulated from and overlap with metal lines M. FIG. 12 only schematically shows a position of the capacitance compensation portion 1021. Alternatively, each of the metal lines may be insulated from and overlap with a plurality of capacitance compensation portions, or one capacitor compensation portion may be insulated from and overlap with a plurality of metal lines simultaneously. After a capacitance compensation portion forms a capacitance with a metal line, the capacitance of the data line electrically connected to the metal line may be compensated, and the load on the data line may be increased. Accordingly, this configuration may improve the display unevenness phenomenon mentioned in the embodiment shown in FIG. 5, and thus improve the display effect.

Figure 13:
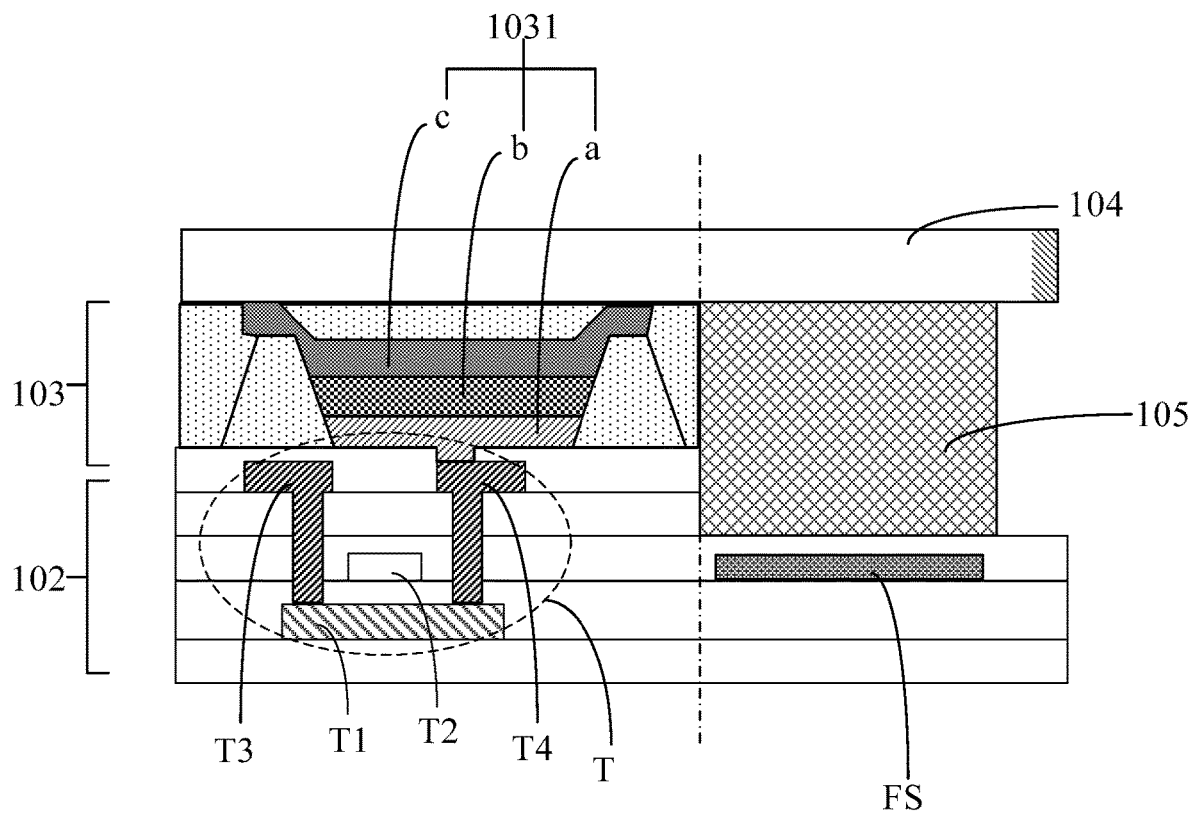
FIG. 13 illustrates is a schematic cross-sectional view of an exemplary implementation approach of a display panel consistent with the disclosed embodiments.
Figure 14:
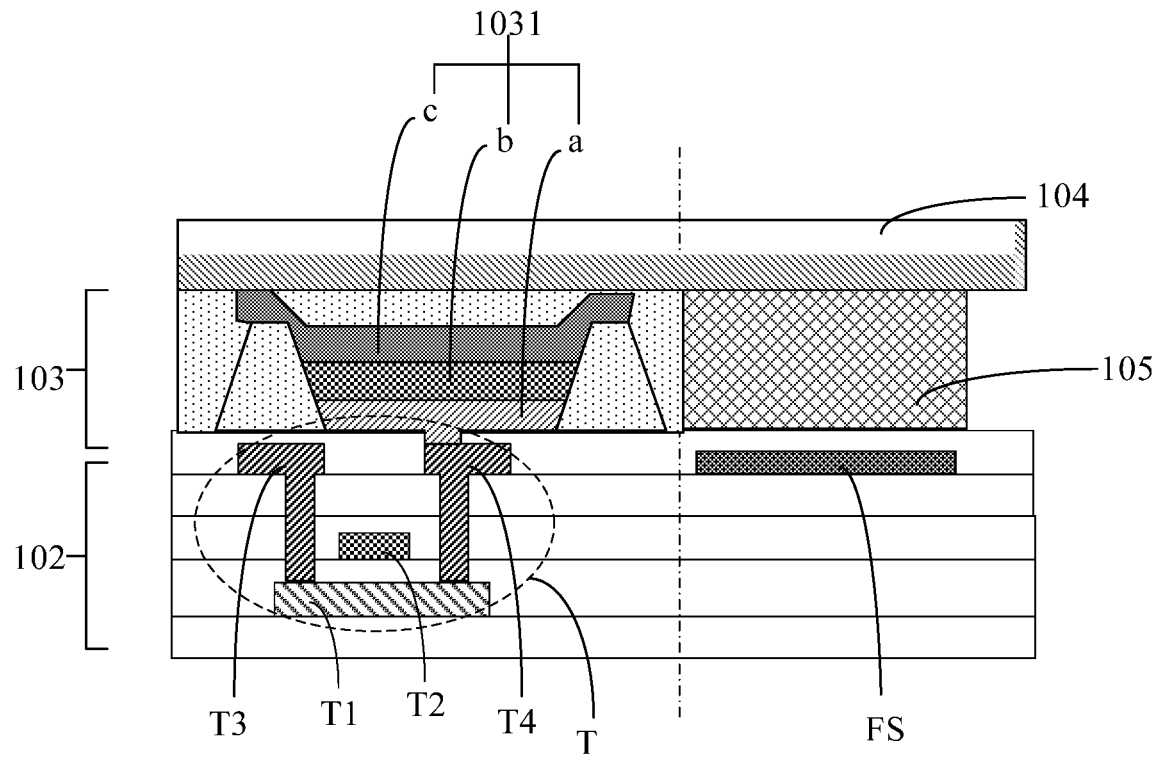
FIG. 14 illustrates is a schematic cross-sectional view of another exemplary implementation approach of a display panel consistent with the disclosed embodiments.
Figure 15:
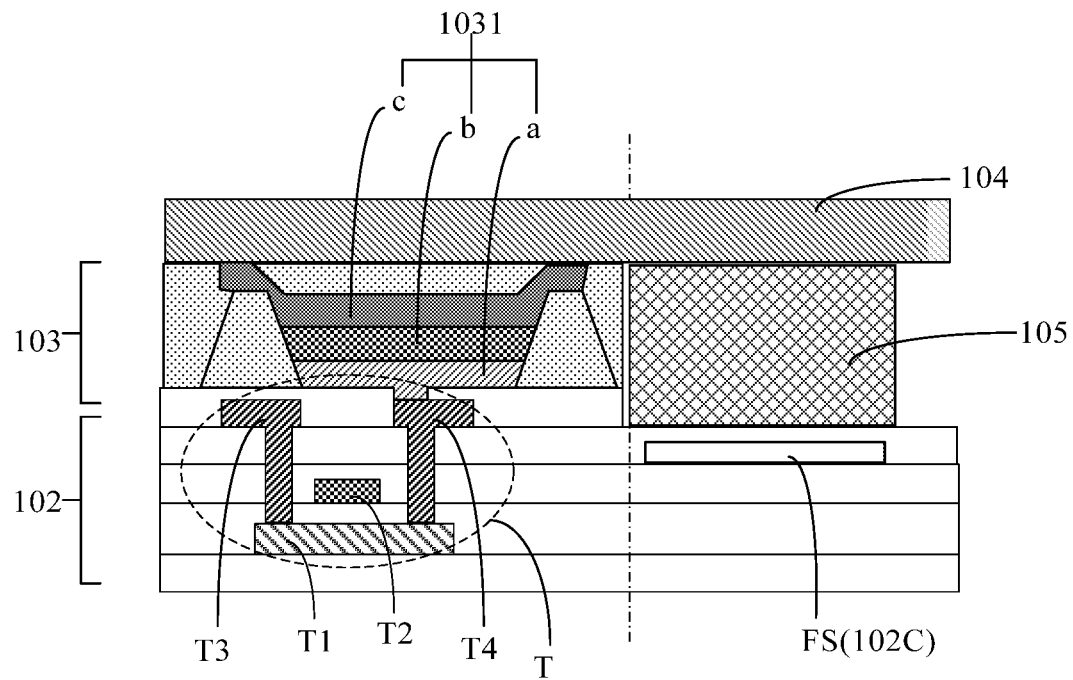
FIG. 15 illustrates is a schematic cross-sectional view of another exemplary implementation approach of a display panel consistent with the disclosed embodiments.

As shown in FIGS. 13-15, in display panels provided by the present disclosure, encapsulated metals may be located at different positions. FIG. 13 illustrates a schematic cross-sectional view of an exemplary implementation approach of a display panel. As shown in FIG. 13, the array layer 102 includes a plurality of thin film transistors T, and a thin film transistor includes an active layer T1, a gate T2, a source T3, and a drain T4. FIG. 13 uses a thin film transistor with a top gate structure as an example. A light emitting device 1031 in the display layer 103 includes an anode a, a light emitting layer b, and a cathode c. The anode a of the light emitting device 1031 schematically shown in FIG. 13 is connected to the drain T4 of the thin film transistor T. The encapsulated metal FS and the gate T2 are located in a same layer. In the fabrication process of a display panel, the encapsulated metal FS and the gate T2 may be fabricated in a same process. To ensure that the encapsulated metal FS can effectively reflect laser in a laser-sintering process of an encapsulant, fewer layers between the encapsulated metal FS and the encapsulant would be favorable. Accordingly, in subsequent fabrication processes, most of the insulating film layers above the encapsulated metal FS may be etched away.

FIG. 14 illustrates is a schematic cross-sectional view of another exemplary implementation approach of a display panel. As shown in FIG. 14, the array layer 102 includes a plurality of thin film transistors T, and a thin film transistor includes an active layer T1, a gate T2, a source T3 and a drain T4. The encapsulated metal FS, the source T3 and the drain T4 are in a same layer. In the fabrication process of a display panel, the encapsulated metal FS, the source T3 and the drain T4 layer may be fabricated in a same process.

FIG. 15 illustrates is a schematic cross-sectional view of another exemplary implementation approach of a display panel. As shown in FIG. 15, the array layer 102 includes a plurality of thin film transistors T, and a thin film transistor T includes an active layer T1, a gate T2, a source T3, and a drain T4. The array layer 102 further includes a pixel capacitor, and the pixel capacitor may make a pixel to illuminate for a certain period of time. The pixel capacitor includes two plates, wherein the gate T2 of the thin film transistor T is reused as one plate, and the other plate is made from a capacitor metal layer 102C. The plates of the pixel capacitor are not labelled in FIG. 15. The encapsulated metal FS and the plate of the pixel capacitor is located on a same layer, and the package metal FS and the pixel capacitor plate may be fabricated in a same process.

In some other embodiments, the encapsulated metal may have a plurality of openings, and the shape of the openings may be a circular or a long strip. The openings of the encapsulated metal provide spaces for thermal expansion and contraction of the encapsulated metal. Accordingly, in a laser-sintering process of the encapsulant, the deformation of the encapsulated metal due to thermal expansion and contraction may be avoided, and thus the packaging effect may be ensured.

Figure 16:
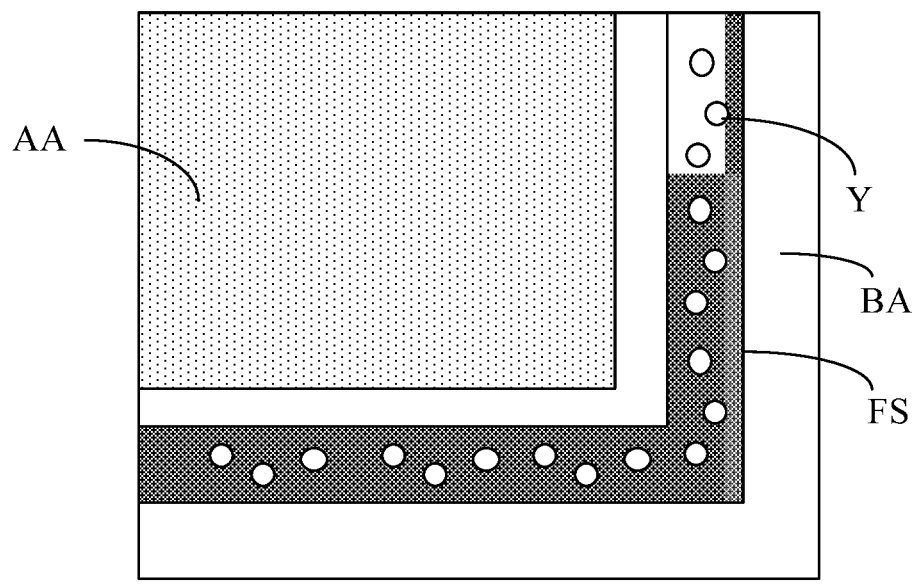
FIG. 16 illustrates an exemplary partial enlarged schematic view of region Z1 in FIG. 1, consistent with the disclosed embodiments.

FIG. 16 illustrates an exemplary partial enlarged schematic view of region Z1 in FIG. 1. As shown in FIG. 16, the encapsulated metal FS has a plurality of openings Y. The openings Y have a circular shape, and the sizes of the openings Y may be non-uniform. The openings Y may be regular circles or irregular circles. The encapsulated metal FS has a plurality of discretely disposed openings Y. The openings Y may provide spaces for thermal expansion and contraction of the encapsulated metal in a laser-sintering process of the encapsulant, thereby ensuring the packaging effect.

Figure 17:
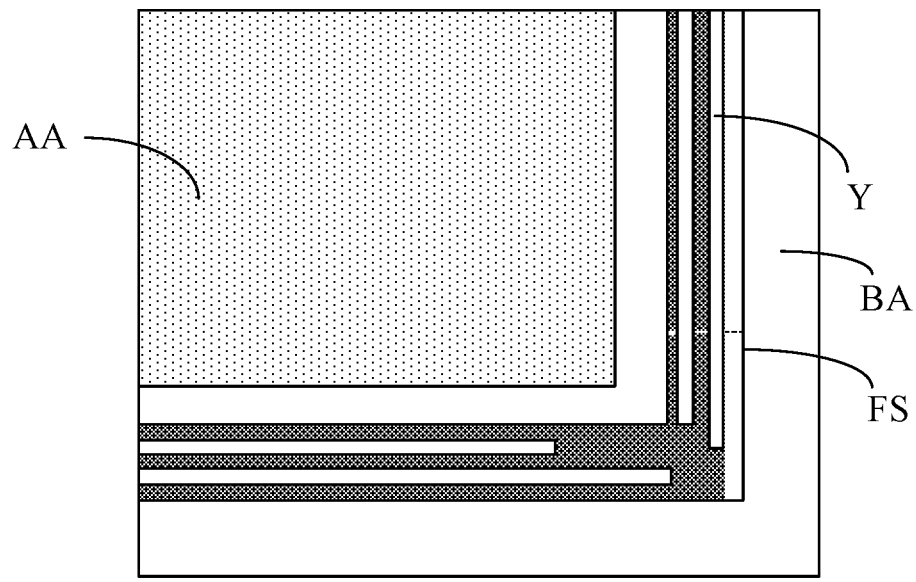
FIG. 17 illustrates another exemplary partial enlarged schematic view of region Z1 in FIG. 1, consistent with the disclosed embodiments.

FIG. 17 illustrates another exemplary partial enlarged schematic view of region Z1 in FIG. 1. As shown in FIG. 17, the encapsulated metal FS has a plurality of openings Y, and the openings Y have a long strip shape. The lengths of the long-strip shape openings Y may be non-uniform. The openings Y provide spaces for thermal expansion and contraction of the encapsulated metal in a laser-sintering process of the encapsulant, thereby ensuring the packaging effect.

The openings shown in FIGS. 16 and 17 are only schematic representations and are not intended to limit the present disclosure. The openings on a encapsulated metal FS may have other shapes, and the shapes of the openings may be combinations of several shapes.

A driving circuit may be disposed in a non-display area of a display panel, and the driving circuit is used to drive signal lines in a display area. The driving circuit occupies most of the space of the non-display area. To further narrow the non-display area, the driving circuit in a display panel is specially designed. Different driving approaches are used for different display areas in a display panel. The driving circuit of a display panel includes a plurality of shift registers. To narrow the notched non-display area and further increase the screen ratio, no shift register is disposed in the notched non-display area.

Figure 18:
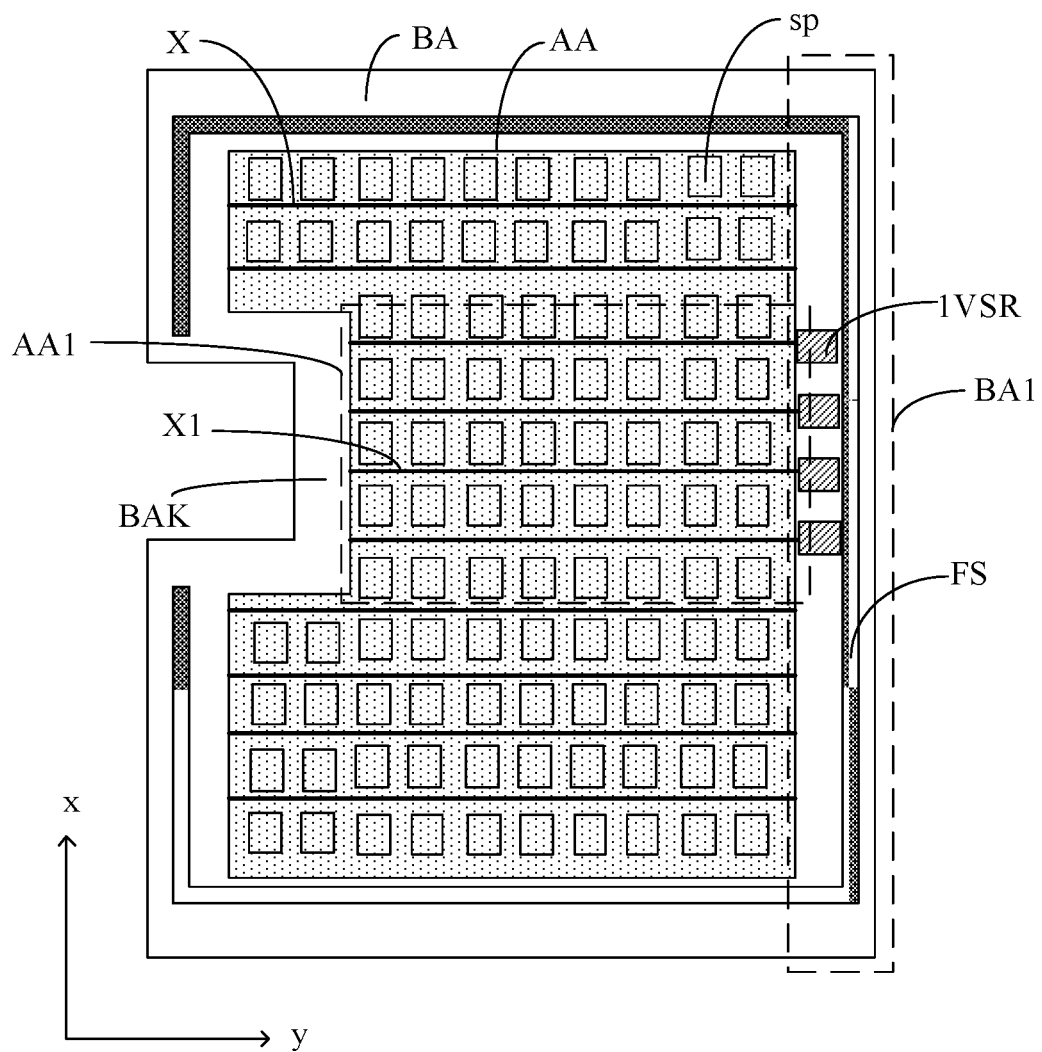
FIG. 18 illustrates a schematic view of an exemplary implementation approach of a display panel consistent with the disclosed embodiments.
Figure 19:
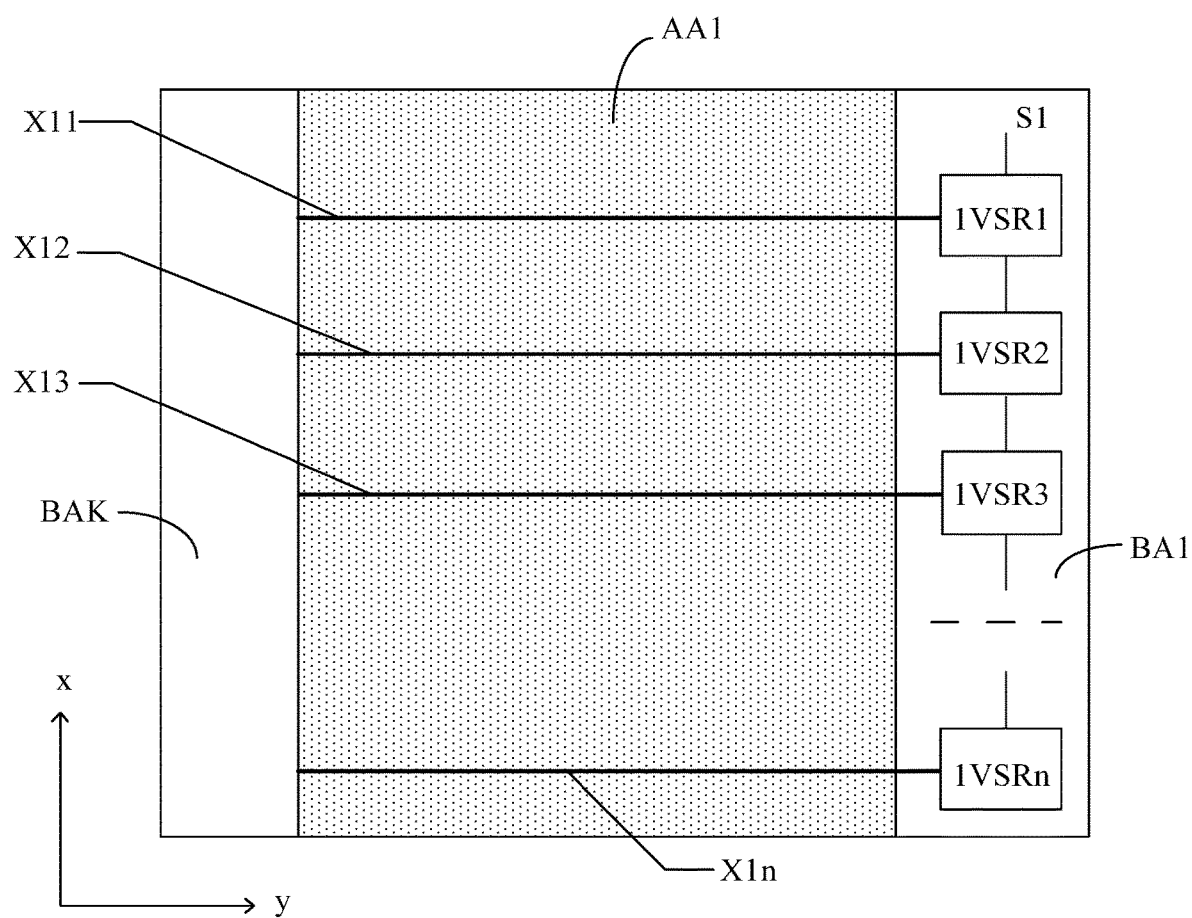
FIG. 19 illustrates a schematic view of driving a first display area in the embodiment shown in FIG. 18, consistent with the disclosed embodiments.

In some embodiments of the present disclosure, since no shift register is disposed in the notched non-display area, signal lines in the display area adjacent to the notched non-display area may be driven by using a one-side driving mode. FIG. 18 illustrates a schematic view of an exemplary implementation approach of a display panel. FIG. 19 illustrates a schematic view of driving a first display area in the embodiment shown in FIG. 18.

As shown in FIG. 18, a display area AA includes a plurality of arrayed sub-pixels sp. The display area AA comprises a first display area AA1, and the first display area AA1 is adjacent to a notched non-display area BAK in the second direction y. The non-display area BA further includes a first non-display area BA1. In the second direction y, the first non-display area BA1 and the notched non-display area BAK are respectively located at two sides of the first display area AA1. The display panel includes a plurality of signal lines X extending in the second direction y. The plurality of signal lines X are arranged along the first direction x. One signal line X provides signals to a plurality of sub-pixels sp located in a same row in the second direction y. The signal lines X include a first signal line X1, and the first signal line X1 is located in the first display area AA1. The shift registers include a plurality of first shift register 1VSR, and the plurality of first shift registers 1VSR are disposed in the first non-display area. The first shift register 1VSR is located at a side of the package metal FS near the display area AA, wherein one first shift register 1VSR is electrically connected to one first signal line X1.

As shown in FIG. 19, in the first non-display area BA1, a plurality of first shift registers 1VSR are cascaded. An input end of the first first shift register 1VSR1 receives a start signal S1. The input terminals of the second first shift register 1VSR2 to the nth first shift register 1VSRn are electrically connected to the output terminal of the previous stage first shift register 1VSR. A plurality of first signal lines X1 are arranged in the first direction x at the first display area AA1. The first first signal line X11 is connected to the first first shift register 1VSR1, and the second first signal line X12 is connected to the second first shift register 1VSR2, and sequentially, the nth first signal line X1n is connected to the nth first shift register 1VSRn, where n is a positive integer. The start signal S1 may be a signal inputted by a wire directly from a driving chip (IC), or the start signal S1 may be a signal outputted by an output terminal of another shift register in the first non-display area BA1.

In one embodiment, a first signal line located in a first display area is connected to a first shift register located in a first non-display area, and one first shift register drives one first signal line. First shift registers located in the first non-display area may be cascaded to form a first shift register group. The first display area may be driven by driving the first signal lines with the first shift register group. The first display area may be driven by a one-side driving mode. As no shift registers are needed in the notched non-display area adjacent to the first display area, the space of the notched non-display area may be saved. Accordingly, this configuration may narrow the notched non-display area.

In a display panel provided by the present disclosure, no shift register is disposed in a notched non-display area, and a first display area is driven by a one-side driving mode, and thus the notched non-display area may be narrowed. Other display areas in the display panel may be driven by different modes. Following embodiments exemplify the driving modes for other display areas except the first display area in a display panel, and the driving modes for an entire display panel.

Figure 20:
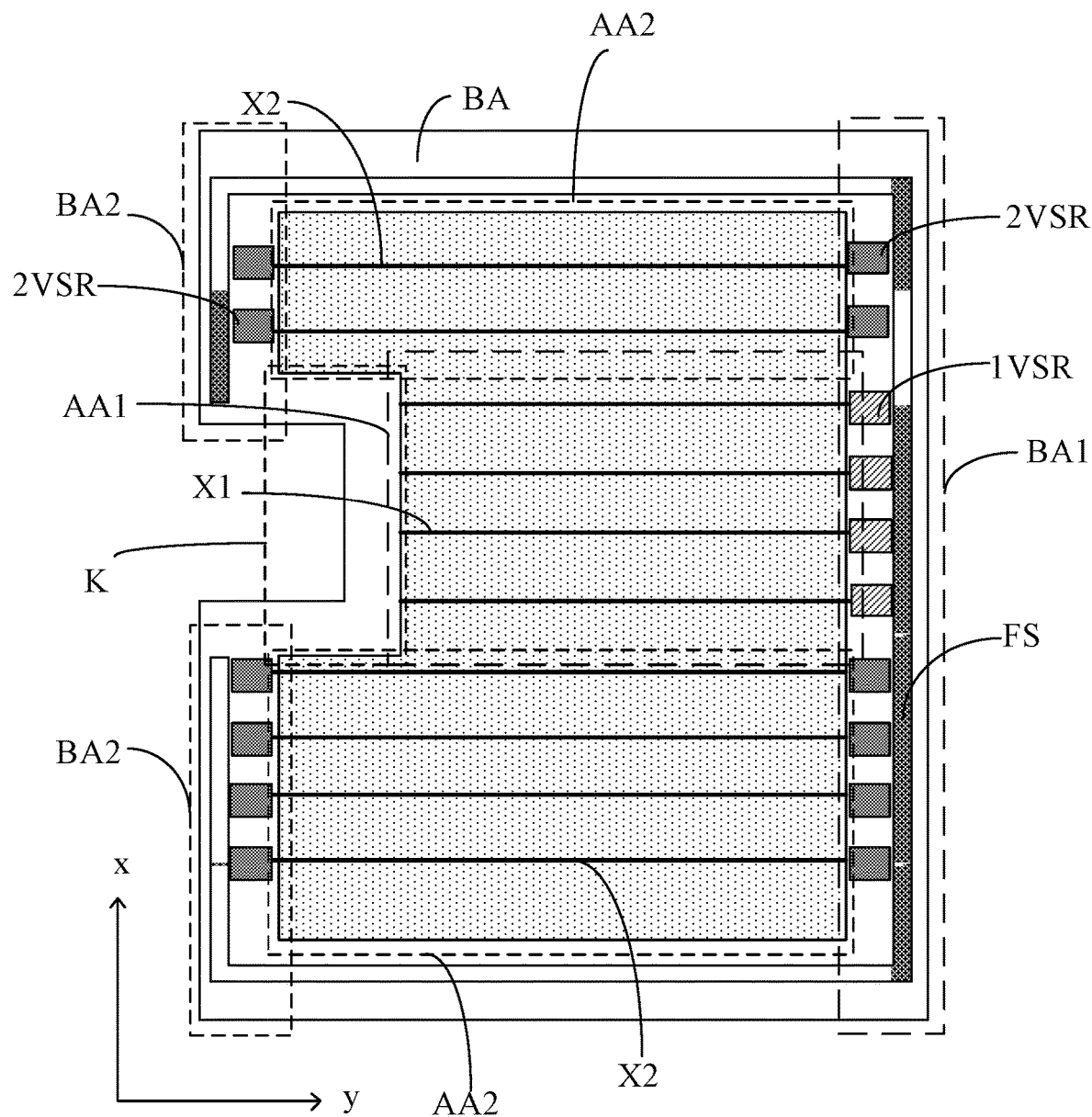
FIG. 20 illustrates a schematic view of another exemplary implementation approach of a display panel consistent with the disclosed embodiments.
Figure 21:
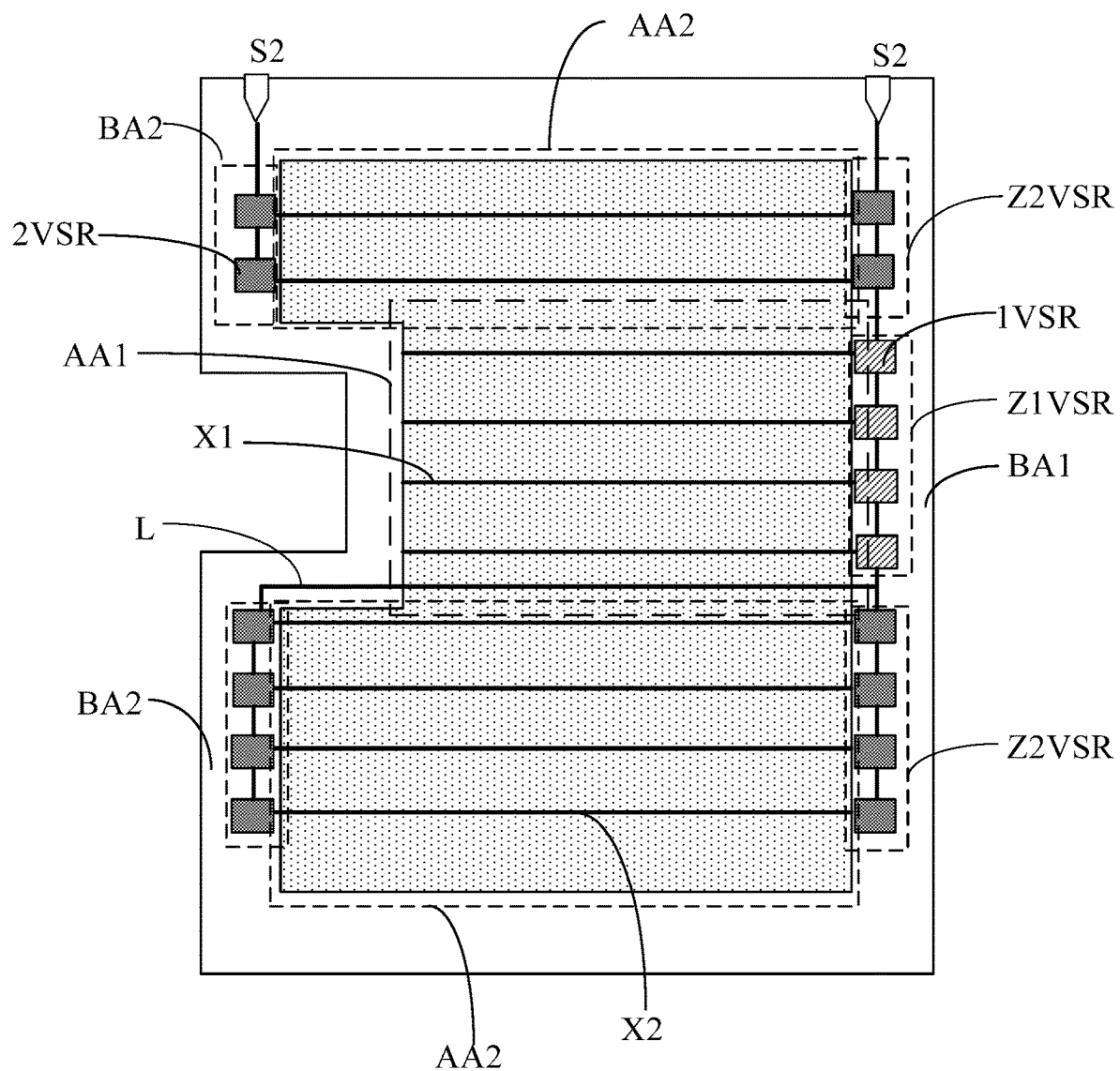
FIG. 21 illustrates a schematic view of an exemplary driving mode of the display panel shown in FIG. 20, consistent with the disclosed embodiments.
Figure 22:
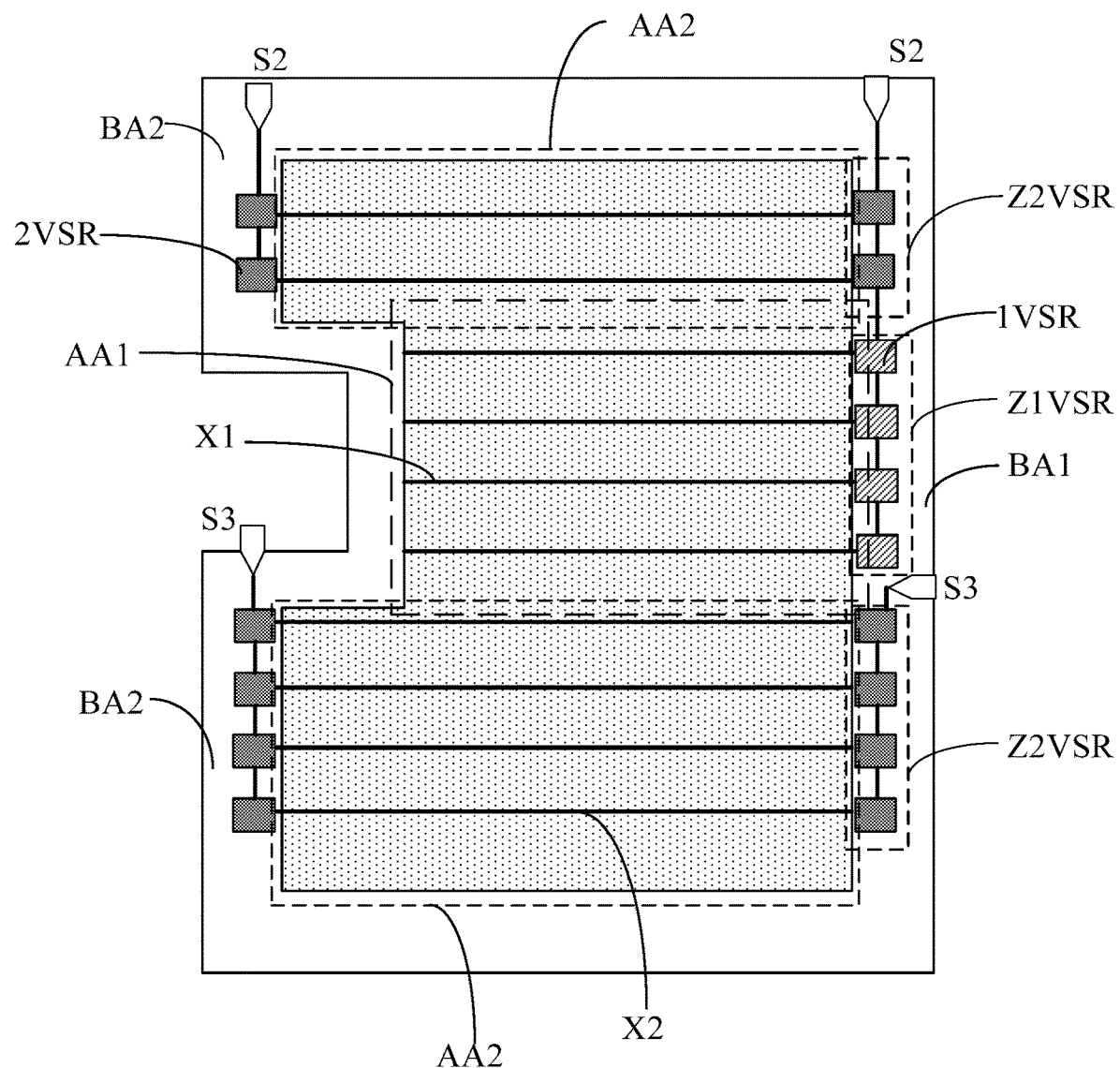
FIG. 22 illustrates a schematic view of another exemplary driving mode of the display panel shown in FIG. 20, consistent with the disclosed embodiments.

FIG. 20 illustrates a schematic view of another exemplary implementation approach of a display panel. FIG. 21 illustrates a schematic view of an exemplary driving mode of the display panel shown in FIG. 20. FIG. 22 illustrates a schematic view of another exemplary driving mode of the display panel shown in FIG. 20.

As shown in FIG. 20, the display area AA further includes second display areas AA2. In the first direction x, the two second display areas AA2 are respectively located at two sides of the notch K. The non-display area BA further includes a second non-display area BA2. In the second direction y, the second non-display area BA2 and the first non-display area BA1 are respectively located at two sides of the second display area AA2. The signal lines X further includes second signal lines X2, and the second signal lines X2 are located at the second display area AA2. The shift registers include second shift registers 2VSR, and a plurality of second shift registers 2VSR are disposed in the first non-display area BA1 and the second non-display area BA2. The second shift registers 2VSR are located at a side of the encapsulated metal FS close to the display area AA. One second signal line X2 is electrically connected to two second shift registers 2VSR located in the first non-display area BA1 and the second non-display area BA2, respectively. In one embodiment, no shift register is disposed in the notched non-display area, and the display in the first display area is driven by a one-side driving mode. This configuration may narrow the notched non-display area. The display of the second display area in the display panel is driven by a two-side drive mode.

In a display panel, when a drive circuit drives signal lines, the signal lines may be scanned from top to bottom, or may be scanned from bottom to top. In the present disclosure, only the scanning from top to bottom is described as an example. As shown in FIG. 21, a display panel includes, from top to bottom, a second display area AA2, a first display area AA1, and a second display area AA2. Second shift registers 2VSR in the second non-display area BA2 are arranged in cascade. The first non-display area BA1 includes two second shift register groups Z2VSR and one first shift register group Z1VSR that are respectively arranged in cascade. The output of the last stage second shift register 2VSR of the first second shift register group Z2VSR in the first non-display area BA1 is electrically connected to the input of the first first shift register 1VSR1 of the first shift register group Z1VSR. The output of the last first shift register 1VSR in the first shift register group Z1VSR is electrically connected to the first second shift register 2VSR of the second second shift register group Z2VSR.

Further, as shown in FIG. 21, the output of the last first shift register 1VSR in the first shift register group Z1VSR is electrically connected to the first second shift register 2VSR in the second non-display area BA2 via a connection line L. In this driving mode, after the first second shift registers 2VSR in the first second display area AA1 receive a start signal S2, all signal lines in the display panel may be driven.

In another driving mode, as shown in FIG. 22, a display panel includes, from top to bottom, a second display area AA2, a first display area AA1, and a second display area AA2. In one embodiment, the second shift registers 2VSR for driving the second signal line X2 in the second second display area AA2 are driven by a new start signal S3.

Figure 23:
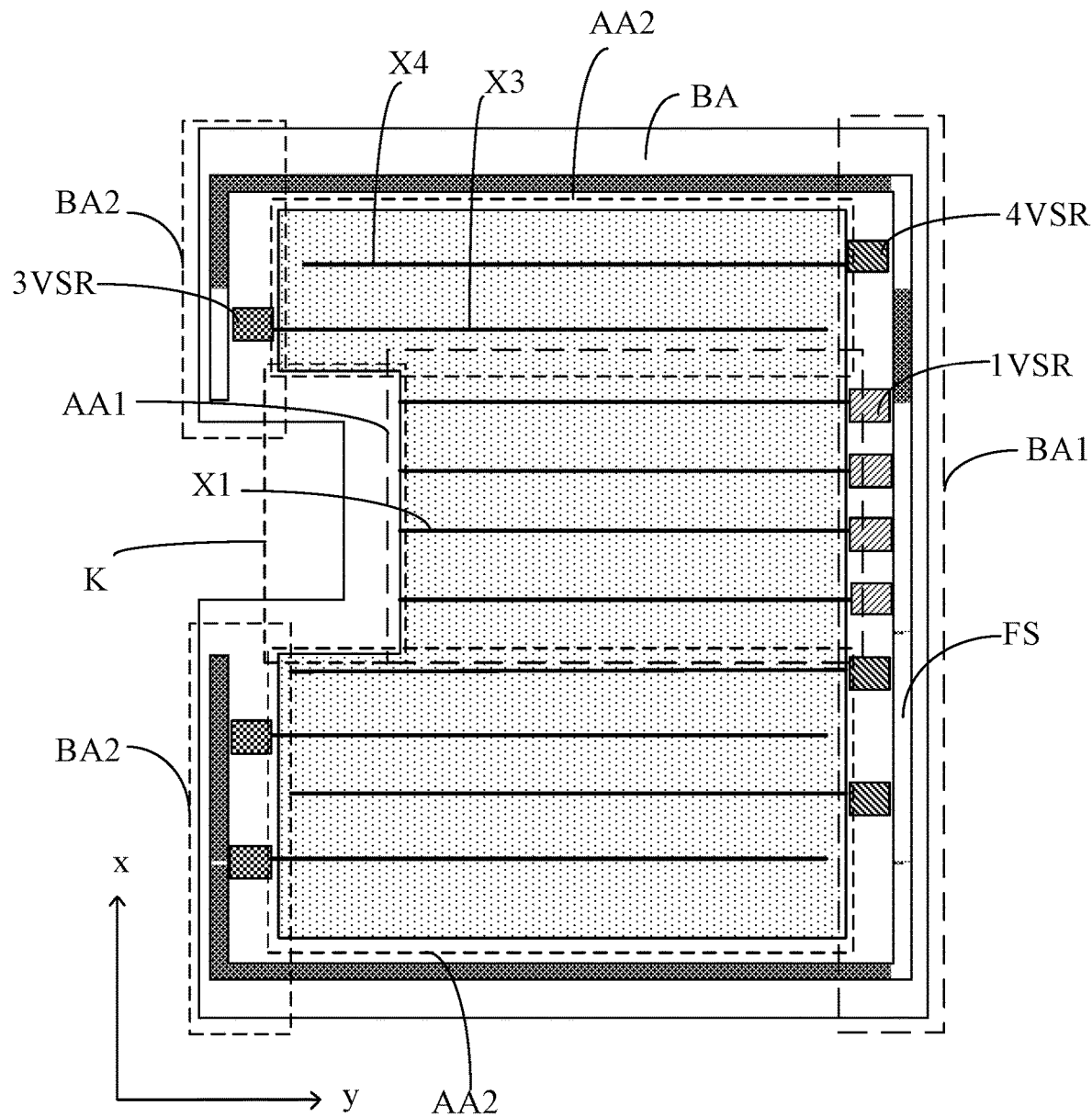
FIG. 23 illustrates a schematic view of another exemplary implementation approach of a display panel consistent with the disclosed embodiments.

FIG. 23 illustrates a schematic view of another exemplary implementation approach of a display panel. As shown in FIG. 23, the display area AA further includes two second display areas AA2, and the two second display areas AA2 are respectively located at two sides of the notch K in the first direction x. The non-display area BA further includes a second non-display area BA2. In the second direction y, the second non-display area BA2 and the first non-display area BA1 are respectively located at two sides of the second display area AA2. The signal lines further include a third signal line X3 and a fourth signal line X4. The third signal line X3 and the fourth signal line X4 are located in the second display area AA2, and the third signal line X3 is adjacent to the fourth signal line X4. The shift register includes third shift registers 3VSR and fourth shift registers 4VSR. The third shift registers 3VSR are disposed in the second non-display area BA2, and the fourth shift registers 4VSR are disposed in the first non-display area BA1. One third signal line X3 is electrically connected to one third shift register 3VSR, and one fourth signal line X4 is electrically connected to one fourth shift register 4VSR.

In one embodiment, no shift register is disposed in the notched non-display area, and the first display area is driven by a one-side driving mode, and thus the notched non-display area may be narrowed. Meanwhile, the second display areas in the display panel are driven by a cross driving mode. Further, as one signal line in the second display area is only electrically connected to one shift register, this configuration may reduce the number of the shift registers in the non-display area, and thus may narrow the non-display area.

For a driving sequence of the display areas in the embodiment shown in FIG. 23, reference may be made to the corresponding embodiments shown in FIG. 21 and FIG. 22, and details are not described herein again.

It should be noted that, in the above embodiments, various parameters (size, number of pixels, etc.) in the two second display areas AA2 located at two sides of the notch K may be identical, or may be different. The shape of the notch K in the above embodiments is illustrated by taking only a rectangular shape as an example. In a display panel provided by the present disclosure, the shape of the notch includes, but is not limited to, a circle, a rectangle, a trapezoid or a triangle.

In the above embodiments, the driving circuit may be a scan driving circuit. In this case, the signal line is a scan line, and the scan line provides a scan signal for sub-pixels in the display panel. The driving circuit may also be an illumination driving circuit. In this case, the signal line is an illumination control signal line, and the illumination control signal line provides an illumination signal for the sub-pixels in the display panel.

Figure 24:
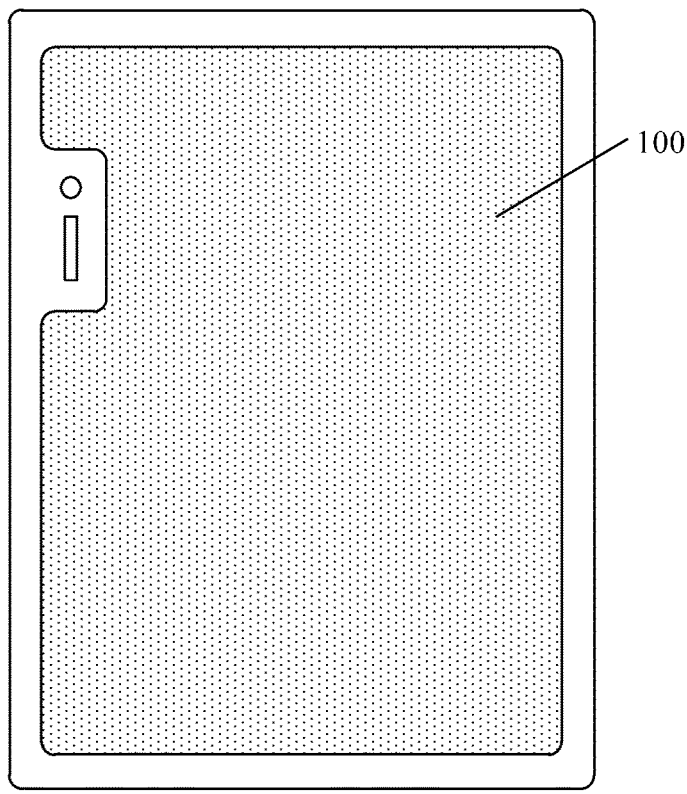
FIG. 24 illustrates a schematic view of an exemplary display device consistent with the disclosed embodiments.

The present disclosure further provides a display device, and FIG. 24 illustrates a schematic view of an exemplary display device. As shown in FIG. 24, the display device includes a display panel 100 provided by any of the embodiments of the present disclosure. The display device may be any electronic product having a flexible display function, including but not limited to the following categories: a television set, a notebook computer, a desktop display, a tablet computer, a digital camera, a mobile phone, a smart bracelet, intelligent glasses, car monitors, medical equipment, industrial equipment, touch interactive terminals, etc.

Figure 25:
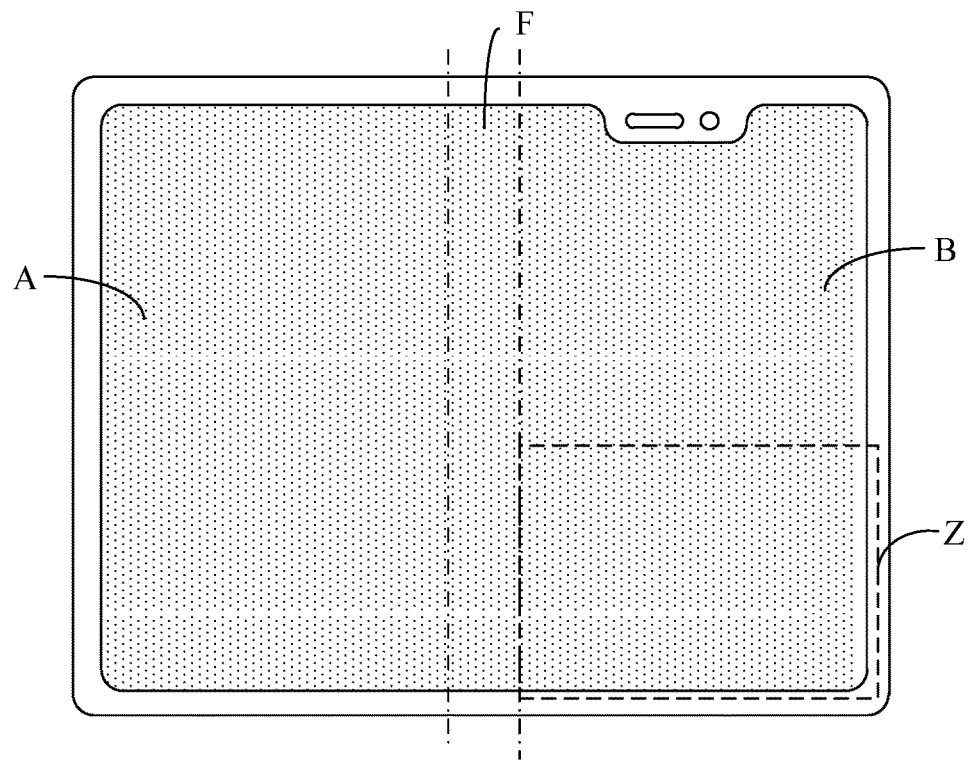
FIG. 25 illustrates schematic view of an exemplary implementation approach of a display device consistent with the disclosed embodiments.

FIG. 25 illustrates schematic view of an exemplary implementation approach of a display device. As shown in FIG. 25, the display device includes two display surfaces A and B, and at least one side display surface F connecting the A side and the B side. Each display surface of the display device is a complete piece of flexible display panel. The display device may be bent along the side display surface F, and the A side and the B side are respectively placed on opposite sides. The display surface of the A side of the display device is a full screen display, and a component area such as a camera and a sensor is reserved on the B side. The electronic paper display area Z may be included on the display surface of the B side. In the electronic paper display area Z, information such as time, date, weather, mobile phone signal, and electricity quantity may be displayed.

It may be seen from the above embodiments that in a display panel provided by the present disclosure, no encapsulated metal is disposed in at least a part of the notched non-display area. Such a configuration may save space in the notched non-display area, thereby increasing the screen ratio.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A display panel comprising:
a display area and a non-display area surrounding the display area, wherein:
the display area is disposed with a plurality of data lines extending along a first direction; the display area has a notch, and a boundary of the display area is recessed into the display area in a second direction to form the notch; the second direction intersects with the first direction; and the non-display area includes a notched non-display area that surrounds the notch by substantially in half; and
the display panel includes:
a substrate layer;
an array layer located over the substrate layer, wherein the data lines are located at the array layer;
a display layer located at a side of the array layer away from the substrate layer, wherein the display layer includes a plurality of light emitting components;
an encapsulation cover located at a side of the display layer away from the array layer;
an encapsulant disposed between the array layer and the encapsulation cover, wherein the encapsulant is located in the non-display area and surrounds the display layer; and
an encapsulated metal located in the non-display area, wherein the encapsulated metal is disposed in the array layer; in a laser-sintering process of the encapsulant, the encapsulated metal is used for reflecting laser light; an orthographic projection of the encapsulated metal in the substrate layer has a non-closed pattern; and the encapsulated metal is undisposed in at least a portion of the notched non-display area.

2. The display panel according to claim 1, wherein:
a plurality of metal lines is disposed in the notched non-display area, a part of the metal lines overlaps with the encapsulant in a direction perpendicular to the display panel, and in the laser-sintering process of the encapsulant, the plurality of metal lines reflects the laser light.

3. The display panel according to claim 2, wherein:
two data lines of the plurality of data lines that are located at two sides of the notch and in a same column are electrically connected through a metal line of the plurality of metal lines.

4. The display panel according to claim 3, wherein:
the plurality of metal lines includes first metal lines and second metal lines, located at different layers.

5. The display panel according to claim 4, wherein:
the first metal lines and the data lines are located in a same layer, and the first metal lines are directly connected to the data lines; and
the second metal lines and the data line are connected through first via holes.

6. The display panel according to claim 4, wherein:
in a direction in which the metal lines are arranged, the first metal lines and the second metal lines are alternately disposed.

7. The display panel according to claim 2, wherein a packaging insulation layer is disposed between the encapsulated metal layer and the encapsulant.

8. The display panel according to claim 7, wherein the material of the packaging insulation layer may include silicon oxide or silicon nitride.

9. The display panel according to claim 3, wherein the notched non-display area is disposed with a capacitance compensation portion, and the capacitance compensation portion is insulated from and overlap with metal lines.

10. The display panel according to claim 1, wherein:
the array layer includes a plurality of thin film transistors, and a thin film transistor includes an active layer, a gate, a source, and a drain; and
the encapsulated metal and the gate are located in a same layer.

11. The display panel according to claim 1, wherein:
the array layer includes a plurality of thin film transistors, and a thin film transistor of the plurality of thin film transistors includes an active layer, a gate, a source, and a drain; and
the encapsulated metal, the source and the drain are in a same layer.

12. The display panel according to claim 1, wherein the array layer further includes a pixel capacitor, and the encapsulated metal and the plate of the pixel capacitor are located on a same layer.

13. The display panel according to claim 1, wherein the encapsulated metal may have a plurality of openings.

14. The display panel according to claim 1, wherein:
a driving circuit is disposed in the non-display area, and the driving circuit of a display panel includes a plurality of shift registers; and
no shift register is disposed in the notched non-display area.

15. The display panel according to claim 14, wherein:
the display area includes a plurality of arrayed sub-pixels;
the display area comprises a first display area, and the first display area is adjacent to the notched non-display area in the second direction;
the non-display area further includes a first non-display area, and in the second direction, the first non-display area and the notched non-display area are respectively located at two sides of the first display area;
the display panel includes a plurality of signal lines extending in the second direction, and the plurality of signal lines is arranged along the first direction; one signal line provides signals to a plurality of sub-pixels located in a same row in the second direction; and the signal lines include a first signal line, and the first signal line is located in the first display area; and
the shift registers include a plurality of first shift registers, and the plurality of first shift registers is disposed in the first non-display area; the first shift register is located at a side of the package metal close to the display area, wherein one first shift register is electrically connected to one first signal line.

16. The display panel according to claim 15, wherein:
the display area further includes second display areas, and in the first direction, the two second display areas are respectively located at two sides of the notch;
the non-display area further includes a second non-display area, and in the second direction, the second non-display area and the first non-display area are respectively located at two sides of the second display area;
the signal lines further includes second signal lines, and the second signal lines are located at the second display area; and
the shift registers include a plurality of second shift registers, and the plurality of second shift registers is disposed in the first non-display area and the second non-display area; and the second shift registers are located at a side of the encapsulated metal close to the display area, wherein one second signal line is electrically connected to two second shift registers located in the first non-display area and the second non-display area, respectively.

17. The display panel according to claim 15, wherein:
the display area further includes second display areas, and in the first direction, the two second display areas are respectively located at two sides of the notch;
the non-display area further includes a second non-display area, and in the second direction, the second non-display area and the first non-display area are respectively located at two sides of the second display area;
the signal lines further include a third signal line and a fourth signal line; the third signal line and the fourth signal line are located in the second display area, and the third signal line is adjacent to the fourth signal line; and
the shift register includes third shift registers and fourth shift registers; the third shift registers are disposed in the second non-display area, and the fourth shift registers are disposed in the first non-display area, wherein one third signal line is electrically connected to one third shift register, and one fourth signal line is electrically connected to one fourth shift register.

18. The display panel according to claim 15, wherein the driving circuit may be a scan driving circuit, and the signal line is a scan line.

19. The display panel according to claim 15, wherein the driving circuit may be an illumination driving circuit, and the signal line is an illumination control signal line.

20. A display device, comprising:
a display panel comprising a display area and a non-display area surrounding the display area, wherein:
the display area is disposed with a plurality of data lines extending along a first direction; the display area has a notch, and a boundary of the display area is recessed into the display area in a second direction to form the notch; the second direction intersects with the first direction; and the non-display area includes a notched non-display area that surrounds the notch by substantially in half; and the display panel includes:

a substrate layer;

an array layer located over the substrate layer, wherein the data lines are located at the array layer;

a display layer located at a side of the array layer away from the substrate layer, wherein the display layer includes a plurality of light emitting components;

an encapsulation cover located at a side of the display layer away from the array layer;

an encapsulant disposed between the array layer and the encapsulation cover, wherein the encapsulant is located in the non-display area and surrounds the display layer; and an encapsulated metal located in the non-display area, wherein the encapsulated metal is disposed in the array layer; in a laser-sintering process of the encapsulant, the encapsulated metal is used for reflecting laser light; an orthographic projection of the encapsulated metal in the substrate layer has a non-closed pattern; and the encapsulated metal is undisposed in at least a portion of the notched non-display area.

* * * * *